US008012856B2

(12) United States Patent
von Malm

(10) Patent No.: US 8,012,856 B2
(45) Date of Patent: Sep. 6, 2011

(54) METHOD OF PRODUCING SEMICONDUCTOR COMPONENTS

(75) Inventor: Norwin von Malm, Nittendorf-Thumhausen (DE)

(73) Assignee: OSRAM Opto Semiconductors GmbH, Regensburg (DE)

(*) Notice: Subject to any disclaimer, the term of this patent is extended or adjusted under 35 U.S.C. 154(b) by 0 days.

(21) Appl. No.: 12/957,264

(22) Filed: Nov. 30, 2010

(65) Prior Publication Data
US 2011/0136271 A1   Jun. 9, 2011

(30) Foreign Application Priority Data
Nov. 30, 2009   (DE) .................. 10 2009 056 386

(51) Int. Cl.
*H01L 21/46* (2006.01)
(52) U.S. Cl. ................... 438/460; 257/E31.099
(58) Field of Classification Search .................. 438/460, 438/464, 33; 257/E31.099, E27.051
See application file for complete search history.

(56) References Cited

U.S. PATENT DOCUMENTS

| 7,033,914 | B2 * | 4/2006 | Yee ............... | 438/460 |
| 7,049,175 | B2 * | 5/2006 | Schaper et al. ........ | 438/113 |
| 7,504,317 | B2 * | 3/2009 | Aoki et al. ............ | 438/460 |
| 7,763,139 | B2 * | 7/2010 | Hayashi et al. ........ | 156/249 |
| 2009/0093075 | A1 * | 4/2009 | Chu et al. ........... | 438/33 |
| 2010/0029059 | A1 * | 2/2010 | Matsumura et al. ...... | 438/464 |

FOREIGN PATENT DOCUMENTS

| DE | 10 2007 030 129 | 1/2009 |
| WO | WO 2006/055601 | 5/2006 |
| WO | WO 2009/003442 | 1/2009 |
| WO | WO 2009/092362 | 7/2009 |

OTHER PUBLICATIONS

I. Schnitzer et al., "30% external quantum efficiency from surface textured, thin-film light-emitting diodes", Appl. Phys. Lett. vol. 63, No. 18, pp. 2174-2176, Oct. 18, 1993.

* cited by examiner

*Primary Examiner* — Thao P. Le
(74) *Attorney, Agent, or Firm* — Cozen O'Connor

(57) ABSTRACT

A method is provided for producing a semiconductor component (1) comprising at least one semiconductor body (2) and one connection carrier region (5). A semiconductor layer sequence (20) with an active region (23) intended for generating radiation is deposited on a substrate (25). The semiconductor layer sequence is arranged on a first auxiliary carrier (3) and the substrate is removed. A plurality of semiconductor bodies are formed from the semiconductor layer sequence. A second auxiliary carrier (4) is arranged on the side of the semiconductor layer sequence remote from the first auxiliary carrier. The first auxiliary carrier is removed. A connection carrier (50) with a plurality of connection carrier regions (5) is provided. The second auxiliary carrier is positioned relative to the connection carrier in such a way that at least one of the semiconductor bodies overlaps an associated connection carrier region when viewed in plan view. The at least one semiconductor body is transferred onto the connection carrier region.

15 Claims, 5 Drawing Sheets

US 8,012,856 B2

METHOD OF PRODUCING SEMICONDUCTOR COMPONENTS

RELATED APPLICATIONS

This application claims the priority of German patent application no. 10 2009 056 386.5 filed Nov. 30, 2009, the entire content of which is hereby incorporated by reference.

FIELD OF THE INVENTION

The present application relates to a method of producing semiconductor components.

BACKGROUND OF THE INVENTION

Semiconductor components, for example LED semiconductor chips, are generally manufactured using a plurality of production steps. This may result in a comparatively large proportion of the finished semiconductor components not being functional or at least not meeting the predetermined requirements.

SUMMARY OF THE INVENTION

It is an object of the present application to provide a production method with which semiconductor components may be produced simply and reliably.

In one embodiment, in a method of producing a semiconductor component comprising at least one semiconductor body and a connection carrier region, a semiconductor layer sequence with an active region intended for generating radiation is provided on a substrate. The semiconductor layer sequence is preferably deposited epitaxially on the substrate, for example by means of MOCVD or MBE. The semiconductor layer sequence is arranged on a first auxiliary carrier. The substrate is removed. A plurality of semiconductor bodies are formed from the semiconductor layer sequence. A second auxiliary carrier is arranged and preferably connected in mechanically stable manner on the side of the semiconductor layer sequence remote from the first auxiliary carrier. The first auxiliary carrier is removed. A connection carrier with a plurality of connection carrier regions is provided. The second auxiliary carrier is positioned relative to the connection carrier in such a way that at least one of the semiconductor bodies overlaps an associated connection carrier region when viewed in plan view. The at least one semiconductor body is transferred onto the connection carrier region.

The method steps do not necessarily have to be performed in the sequence listed above.

Using the method described, semiconductor components may be produced in such a way that in each case only functional semiconductor bodies which furthermore meet the predetermined requirements are transferred to in each case associated connection carrier regions. This very greatly reduces the risk of semiconductor components, which are formed when the connection carrier is singulated into connection carrier regions, not meeting the predetermined requirements, for instance in terms of electronic characteristics and/or spectral emission characteristics.

The substrate may be removed over the entire area. In other words, the substrate does not need to be subdivided in the method, such that the substrate may be reused. In this way, production costs may be greatly reduced.

In a preferred further configuration, the second auxiliary carrier is embodied as a foil. It is additionally preferred for an adhesive property of the second auxiliary carrier to be purposefully locally modifiable. In particular, the adhesive property of the second auxiliary carrier may be reduced by local input of heat into the second auxiliary carrier. This may be achieved for example by means of coherent radiation.

Alternatively or in addition, heat may be input for example by means of a punch. The punch may be brought into thermal contact with the second auxiliary carrier and so bring about input of heat.

By means of the first and second auxiliary carriers, transfer of the semiconductor body to the connection carrier may be performed independently of the substrate for the semiconductor layer sequence, since the latter is removed as prior to the transfer. In contrast to a method in which the semiconductor bodies are transferred directly by means of selective removal by laser radiation from a transparent growth substrate, for example sapphire, to a connection carrier, the above-described method may also be used for semiconductor layer sequences which have been deposited on a substrate which does not transmit radiation. Thus, for example silicon or gallium arsenide may also be used for the substrate. The method is therefore also suitable for example for semiconductor components in which the semiconductor bodies are intended for producing red radiation and are for example deposited epitaxially on a gallium arsenide substrate. A silicon substrate may for example be used for the deposition of a semiconductor body based on a nitride compound semiconductor, in particular $Al_xIn_yGa_{1-x-y}N$ with $0 \leq x \leq 1$, $0 \leq y \leq 1$ and $x+y \leq 1$, in particular with $x \neq 1$, $y \neq 1$, $x \neq 0$ and/or $y \neq 0$.

In a preferred configuration, a separation layer is formed between the semiconductor layer sequence and the first auxiliary carrier. The separation layer may in particular be deposited on the first auxiliary carrier or on the semiconductor layer sequence.

The separation layer is preferably configured such that the first auxiliary carrier may be removed by means of at least partial decomposition of the separation layer.

A nitride, for instance silicon nitride, is for example suitable for the separation layer. Such a material may be decomposed by means of coherent radiation, for example laser radiation. Preferably, the first auxiliary carrier is configured to be transmissive for the coherent radiation, such that the coherent radiation may be introduced through the first auxiliary carrier on removal of the first auxiliary carrier.

The first auxiliary carrier is provided in particular for mechanical stabilization of the semiconductor layer sequences. The substrate on which the semiconductor layer sequence was deposited is no longer necessary for this purpose and may therefore be removed. The first auxiliary carrier may be embodied as an in particular rigid carrier.

A semiconductor component in which the growth substrate has been removed is also known as a thin-film semiconductor component.

A thin-film semiconductor component, for instance a thin-film light-emitting diode chip, may furthermore be distinguished for the purposes of the present invention by at least one of the following characteristic features:

on a first major surface, facing the carrier element, for instance the connection carrier region, of a semiconductor body comprising a semiconductor layer sequence with an active region, in particular of an epitaxial layer sequence, a mirror layer is applied or formed, for instance integrated as a Bragg mirror in the semiconductor layer, said mirror layer reflecting back into the semiconductor layer sequence at least some of the radiation generated in said sequence;

the semiconductor layer sequence has a thickness in the range of 20 µm or less, in particular in the range of 10 µm; and/or the semiconductor layer sequence contains at least one semiconductor layer with at least one face which comprises an intermixing structure, which ideally leads to an approximately ergodic distribution of the light in the semiconductor layer sequence, i.e. it exhibits scattering behavior which is as ergodically stochastic as possible.

The basic principle of a thin-film light-emitting diode chip is described for example in I. Schnitzer et al., Appl. Phys. Lett. 63 (16), 18 Oct. 1993, 2174-2176, whose disclosure content is hereby included by reference in this respect in the present application.

It is additionally preferable for the first auxiliary carrier to exhibit high chemical stability. The risk of damage to the first auxiliary carrier during production of the semiconductor component, for example during an etching process, may be reduced. For example, the first auxiliary carrier may contain a glass or sapphire or consist of such a material.

In a preferred development, before the semiconductor layer sequence is arranged on the first auxiliary carrier an electrically conductive bonding layer is applied to the semiconductor layer sequence. The bonding layer may here be applied continuously to the semiconductor layer sequence and furthermore be of unstructured configuration. The bonding layer may thus cover the entire area of the semiconductor layer sequence.

The bonding layer may for example contain a solder, for instance a solder paste or an electrically conductive adhesive.

In a further preferred development the semiconductor bodies are tested prior to transfer onto the connection carrier regions. For example, the semiconductor bodies may be tested with regard to an electrical and/or spectral characteristic. It may in this way be ensured that the connection carrier regions are only populated with functional semiconductor bodies.

In a preferred development, electrical testing of the semiconductor bodies takes place as early as before the semiconductor bodies are arranged on the second auxiliary carrier. In this case the semiconductor bodies are accessible from the side remote from the first auxiliary carrier.

Furthermore, during testing the semiconductor bodies preferably comprise a common contact at least on one side, in particular on the side facing the first auxiliary carrier. The bonding layer or a contact layer arranged on the semiconductor bodies may in particular form the common contact for the semiconductor bodies. The semiconductor bodies are conveniently individually and thus mutually independently contactable from the side of the active region remote from the common contact. The injection of charge carriers from two different sides of the active region of the semiconductor body to be tested into the active region may thereby be achieved in a simplified manner. After testing, the common contact between the semiconductor bodies may no longer be necessary and may be severed. During production, the bonding layer and/or the contact layer may thus constitute a temporary common contact.

In a further preferred development a conversion layer is applied to the semiconductor layer sequence. This may take place as early as before the second auxiliary carrier is arranged on the semiconductor layer sequence.

The conversion layer may for example be embodied as a small prefabricated plate. The small plate may be based on a ceramic or on silicone, wherein a conversion material, for instance a luminescence converter, may be embedded in the small plate.

Alternatively, the conversion layer may also be deposited onto the semiconductor layer sequence. The conversion layer may contain a semiconductor material or a ceramic material or consist of such a material. A conversion layer applied over the entire area may subsequently be structured, for example using a photolithographic method.

The conversion layer is conveniently intended to convert radiation generated by the semiconductor body when the semiconductor component is in operation at least partially into secondary radiation of a longer or shorter wavelength. In this way, a semiconductor component may be produced which generates mixed radiation, in particular mixed radiation which appears white to the human eye. Alternatively, the semiconductor component may be constructed such that the primary radiation generated in the active region is converted completely by means of the conversion layer into secondary radiation.

In a preferred further development, a color locus of radiation emitted by the semiconductor body and by the conversion layer is determined prior to transfer of the semiconductor bodies onto the connection carrier region. Even before arrangement of the semiconductor bodies on the connection carrier regions, it may thus be ensured that the color locus of the radiation emitted by the semiconductor component, in particular mixed radiation with fractions consisting of primary radiation of the active region and secondary radiation, lies within a predetermined region.

Semiconductor bodies which in particular do not fulfill electrical requirements and/or requirements in terms of color locus may on the other hand remain on the second auxiliary carrier and are thus not arranged on the connection carrier.

The semiconductor components are preferably formed by means of singulating the connection carrier, this particularly preferably taking place after transfer of the semiconductor bodies onto the connection carrier regions. The connection carrier may thus be populated with a plurality of semiconductor bodies while still in one piece, division of the connection carrier resulting in completely finished semiconductor components with in each case at least one semiconductor body and one connection carrier region.

In a preferred further development, the active region of the semiconductor components is connected in electrically conductive manner from both sides with the in each case associated connection carrier region prior to singulation of the connection carrier. This preferably proceeds simultaneously for all of the regions arranged on the connection carrier. It is possible to dispense with the production of individual electrically conductive connections of the semiconductor bodies with the associated connection carrier region.

In a preferred configuration, a center-to-center distance between adjacent connection carrier regions on the connection carrier is greater in at least one direction than a center-to-center distance between adjacent semiconductor bodies on the second auxiliary carrier. In other words, the arrangement of the semiconductor bodies on the second auxiliary carrier and the arrangement of the connection carrier regions on the connection carrier are not necessarily congruent. Instead, the center-to-center distances may be established mutually independently or at least largely mutually independently.

In particular, the dimensions of the connection carrier regions may thus be retained for different sizes of semiconductor body. In other words, the radiant power emitted by the semiconductor components may for example be varied by changing the size of the semiconductor body, without the size of the connection carrier region being changed at the same time.

In a further preferred configuration, the connection carrier regions comprise an electronic component, for example a protection diode. The electronic component, for instance the protection diode, may in particular be integrated into the connection carrier.

A protection diode may protect the semiconductor component in particular from electrostatic discharge (electrostatic discharge, ESD). The semiconductor body may already be protected from ESD damage during production of the semiconductor component, in particular prior to singulation of the connection carrier in the connection carrier regions.

In a further preferred configuration, an optical element is applied to at least one semiconductor body, in particular prior to singulation of the connection carrier. The optical element may for example be prefabricated and fixed to the semiconductor body. Alternatively, the optical element may also be formed on the semiconductor body.

DETAILED DESCRIPTION OF THE DRAWINGS

Figure 1A:
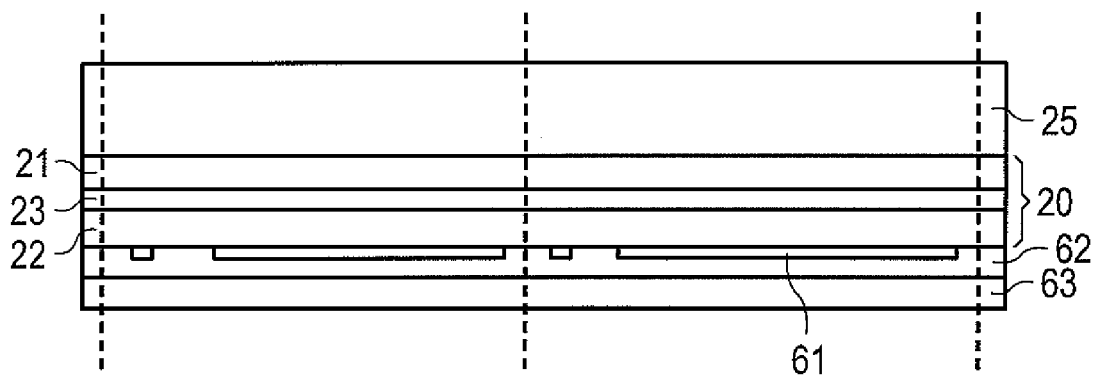
FIGS. 1A to 1H show a first exemplary embodiment of a method by means of intermediate steps shown schematically in sectional view.

Identical, similar or identically acting elements are provided with identical reference numerals in the figures.

The figures are in each case schematic representations and are therefore not necessarily true to scale. Rather, comparatively small elements and in particular layer thicknesses may be illustrated on an exaggeratedly large scale for clarification.

A first exemplary embodiment of a method of producing a semiconductor component, which takes the form of a thin-film semiconductor component, is illustrated schematically in FIGS. 1A to 1H. A semiconductor layer sequence 20 with an active region 23 intended for generating radiation is deposited on a substrate 25. The active region 23 is arranged between a first semiconductor layer 21 and a second semiconductor layer 22, which are conveniently different from one another with regard to conduction type. For example, the first semiconductor layer 21 may be n-conductive and the second semiconductor layer 22 p-conductive or vice versa.

The semiconductor layer sequence 20, in particular the active region 23, preferably contains a III-V semiconductor material.

III-V semiconductor materials are particularly suitable for producing radiation in the ultraviolet ($Al_xIn_yGa_{1-x-y}N$) through the visible ($Al_xIn_yGa_{1-x-y}N$, in particular for blue to green radiation, or $Al_xIn_yGa_{1-x-y}P$, in particular for yellow to red radiation) as far as into the infrared ($Al_xIn_yGa_{1-x-y}As$) range of the spectrum. Here in each case $0 \leq x \leq 1$, $0 \leq y \leq 1$ and $x+y \leq 1$ applies, in particular with $x \neq 1$, $y \neq 1$, $x \neq 0$ and/or $y \neq 0$. Using III-V semiconductor materials, in particular from the stated material systems, it is additionally possible to achieve high internal quantum efficiencies in the generation of radiation.

The substrate 25 is preferably selected with regard to good depositability of the semiconductor layer sequence 20. Sapphire, silicon or gallium nitride are suitable, for example, for a semiconductor layer sequence containing AlInGaN.

On the side remote from the substrate 25, a mirror layer 61 is formed on the semiconductor layer sequence. The mirror layer conveniently displays high reflectivity for the radiation generated in the active region 23. The mirror layer preferably contains a metal or a metallic alloy or consists of a metal or of a metallic alloy. Aluminum, silver, rhodium, palladium, platinum or gold are examples of suitable metals.

A contact layer 62 is formed on the mirror layer. The mirror layer and/or the contact layer may be applied, for example, by means of vapor deposition or sputtering.

The contact layer 62 preferably is embodied as a protective layer for the mirror layer 61. In particular, the contact layer may contain titanium and/or tungsten, in particular the material combination TiWN or consist of such a material.

Charge carriers are injected via the second semiconductor layer 22 into the active region 23 via the contact layer 62 and the mirror layer 61. On the other hand, the contact layer may also fulfill the function of a mirror layer, such that a separate mirror layer is unnecessary.

A bonding layer 63 is formed on the contact layer 62. The bonding layer may for example contain a solder or an electrically conductive adhesive.

Figure 1B:
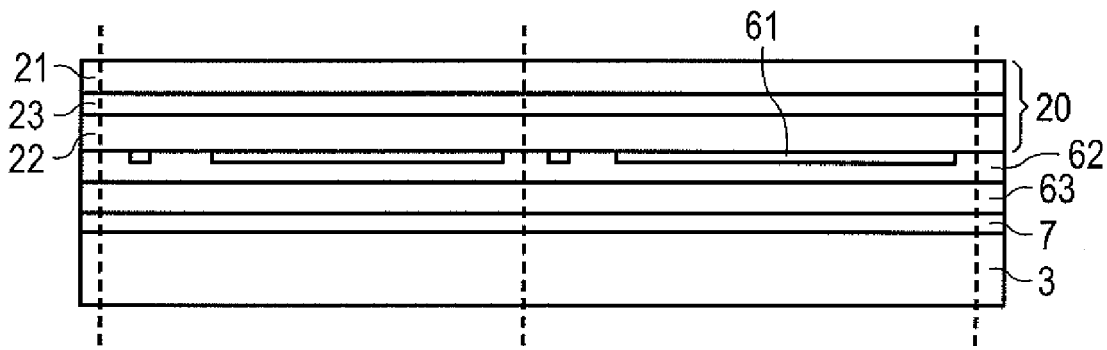

As shown in FIG. 1B, the semiconductor layer sequence 20 is arranged on the side remote from the substrate 25 on a first auxiliary carrier 3 and fixed thereto. Fixing may proceed for example by means of the bonding layer 63.

A separation layer 7 is arranged between the first auxiliary carrier 3 and the semiconductor layer sequence 20, in particular between the first auxiliary carrier 3 and the bonding layer 63.

The separation layer 7 preferably contains a nitride, for example silicon nitride, or consists of such a material.

The first auxiliary carrier 3 is provided in particular for mechanical stabilization of the semiconductor layer sequence 20. The auxiliary carrier is also preferably formed of a material which exhibits high chemical stability. A glass or sapphire is particularly suitable for the first auxiliary carrier.

Once the semiconductor layer sequence 20 has been fixed to the first auxiliary carrier 3 the substrate 25 is no longer needed for mechanical stabilization of the semiconductor layer sequence 20 and may be removed. The substrate may be removed non-destructively and moreover over the entire area. The substrate 25 may thus be reused for the deposition of semiconductor layers.

For example, removal may be performed using coherent radiation, for instance using a laser lift-off method. In this case the substrate is preferably optically transparent, such that the laser radiation may be directed through the substrate. A sapphire substrate is suitable therefor, for example.

Alternatively, the substrate may also be removed mechanically, for instance by means of grinding or lapping, and/or chemically, for instance by means of wet chemical or dry chemical etching. In this case the substrate may be selected irrespective of its optical characteristics. A comparatively inexpensive silicon substrate may be used, for example.

After removal of the substrate 25 the semiconductor layer sequence 20 may be provided with a structuring 81 on the side remote from the first auxiliary carrier 3. The structuring may increase the outcoupling efficiency of the radiation generated in the active region 23. Structuring may proceed mechanically or chemically, for example.

Furthermore, a counter-contact layer 65 may be formed on the semiconductor layer sequence.

One of the materials mentioned in connection with the contact layer 62 and the mirror layer 61 is suitable for the counter-contact layer.

Figure 1C:
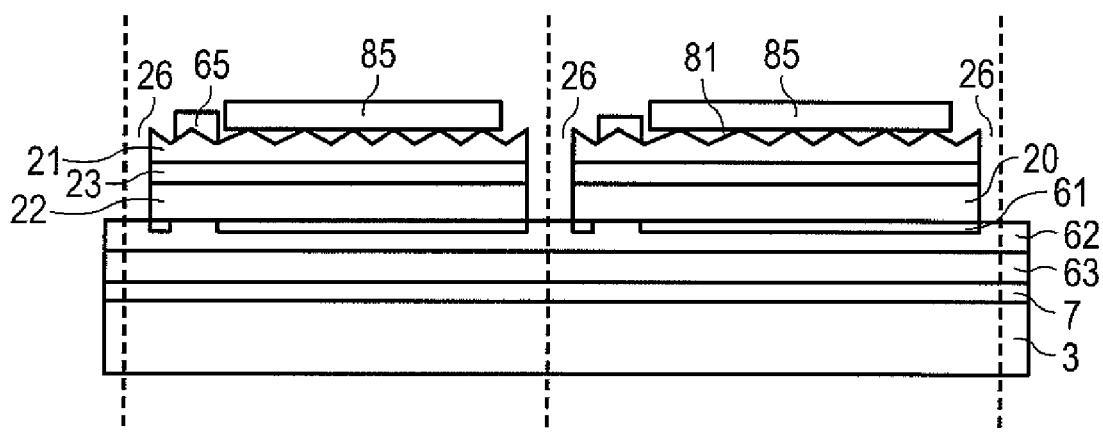

The semiconductor layer sequence 20 is used, as shown in FIG. 1C, to form a plurality of semiconductor bodies 2. This may be achieved by means of recesses 26, which extend through the active region, preferably through the entire semiconductor layer sequence 20.

The recesses 26 may be produced for example chemically, in particular by means of wet chemical or dry chemical etching.

A conversion layer 85 is formed on the semiconductor bodies 2 on the side remote from the first auxiliary carrier. The conversion layer may be provided for example in the form of small prefabricated plates, which are positioned on the semiconductor bodies 2 and fixed to the semiconductor bodies. The small plates may for example contain a ceramic or a silicone, wherein a conversion material, for instance a luminescence converter, may be embedded therein.

Alternatively the conversion layer may also be deposited over the entire surface of the semiconductor layer sequence 20 and subsequently structured, for example by means of a photolithographic method.

The conversion layer may for example contain a semiconductor material, for instance a II-VI compound semiconductor material, a silicone or a ceramic material or consist of such a material.

By means of the conversion layer, radiation generated in the active region 23 may be converted into radiation of a longer or shorter wavelength, such that the semiconductor component may emit mixed radiation with the primary radiation generated in the semiconductor body 2 and the secondary radiation generated by excitation of the conversion layer.

For the production in particular of semiconductor components in which the radiation generated directly in the active region 23 is to be used, formation of the conversion layer 85 may also be dispensed with.

The semiconductor bodies 2 may be electrically tested as early as at this stage of production.

In this case, the continuous bonding layer 63 may in particular serve as a common back contact for all the semiconductor bodies 2 on the first auxiliary carrier 3. On the side remote from the first auxiliary carrier 3, the semiconductor bodies 2 may be in each case individually contactable by means of the counter-contact layer 65, such that charge carriers may be injected from different sides into the active region 23 of the semiconductor bodies 2 and there recombine with the emission of radiation.

Furthermore, the color locus of the semiconductor bodies may be determined. In particular, the color locus may also be measured with the conversion layer already applied to the semiconductor body 2. It is thus possible, as early as at this method stage, to check whether the individual semiconductor bodies 2 together with the conversion layer 85 meet requirements in terms of spectral emission characteristics.

Figure 1D:
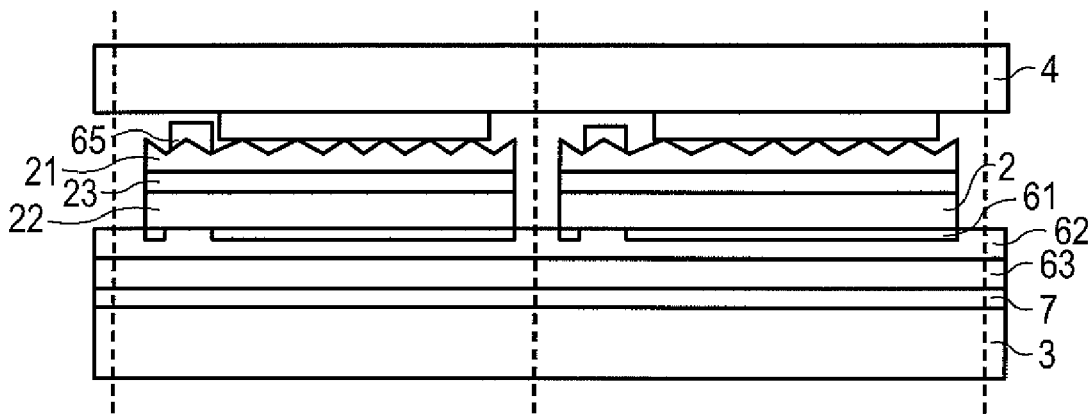

As shown in FIG. 1D, a second auxiliary carrier 4 is arranged on the side of the semiconductor layer sequence remote from the first auxiliary carrier 3. The second auxiliary carrier 4 is preferably mechanically flexible, for example taking the form of a foil.

The second auxiliary carrier 4 additionally preferably comprises an adhesive property for the semiconductor layer sequence 2 which may be locally modified, in particular reduced. A foil is suitable, for example, in which adhesion is locally reduced when heat is input into the foil. Once the semiconductor layer sequence 2 has been fixed to the second auxiliary carrier 4, the first auxiliary carrier 3 may be removed. The first auxiliary carrier is preferably removed by means of decomposition of the separation layer 7. This may proceed for example by directing coherent radiation through the first auxiliary carrier 3.

Directing laser radiation onto silicon nitride, for example, releases gaseous nitrogen, which causes the first auxiliary carrier 3 to snap off. The first auxiliary carrier may here be removed over the entire area, such that the first auxiliary carrier may be reused.

The layers arranged on the side of the semiconductor layer sequence 20 remote from the second auxiliary carrier 4 may subsequently be cut through at separation points 28 (FIG. 1E), for example by means of a laser separation method. The individual semiconductor bodies 2 are thus then only connected together mechanically by way of the second auxiliary carrier 4.

Figure 1E:
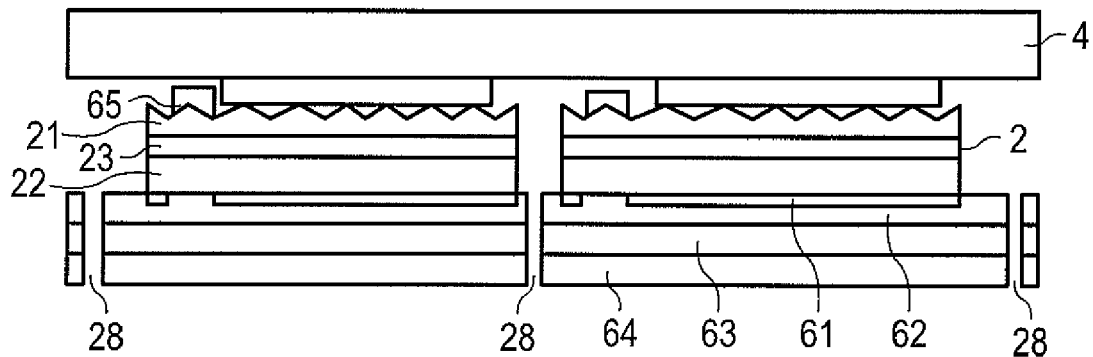

As shown in FIG. 1E, a further bonding layer 64 may be formed on the semiconductor bodies 2, which bonding layer is provided for subsequently fixing the semiconductor bodies 2 to a connection carrier. However, this further bonding layer may also be dispensed with.

Figure 1F:
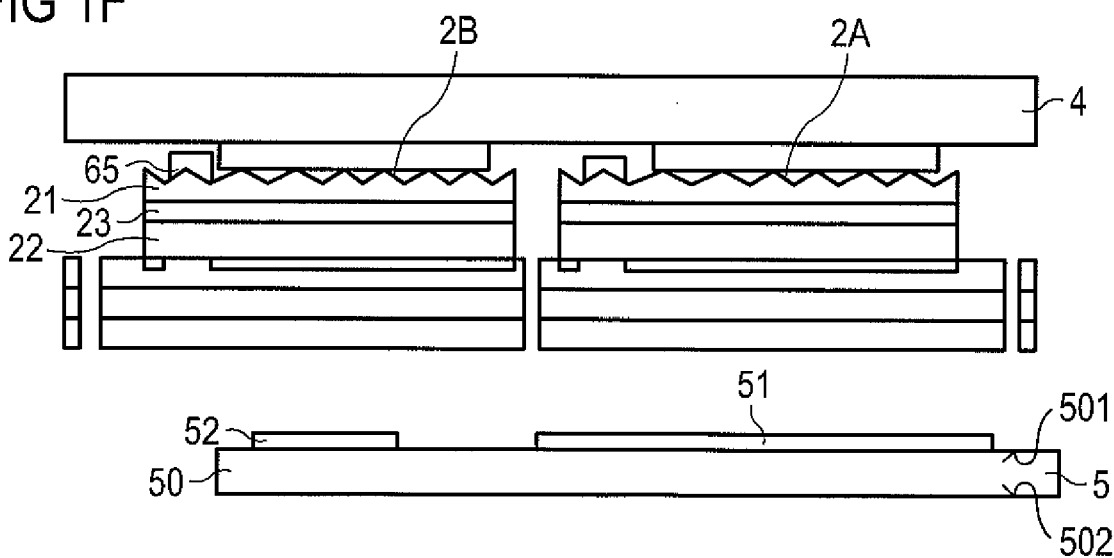

A connection carrier 50 with a plurality of connection carrier regions 5 is provided. To simplify the illustration, FIG. 1F shows just the part of the connection carrier 50 from which, during production, a connection carrier region 5 is produced for a semiconductor body 2.

The second auxiliary carrier is positioned relative to the connection carrier 50 in such a way that at least one of the semiconductor bodies 2A overlaps an associated connection carrier region 5 when viewed in plan view. A connection surface 51 may here be formed on the connection carrier region 5, on which surface the semiconductor bodies may be fixed in a subsequent method step. Furthermore, the connection carrier region 5 comprises a further connection surface 52, which is provided for electrical contacting of the semiconductor body.

The connection surface 51 and/or the further connection surface 52 may in particular be of metallic construction.

After positioning, the semiconductor body 2A provided for fixing on the connection carrier region 5 may be removed from the second auxiliary carrier 4. This may be effected for example by means of local input of heat by laser radiation or by means of a hot punch.

On or after transfer of the semiconductor body 2A, a mechanical and furthermore electrically conductive connection is produced between the semiconductor body 2A and the connection carrier 5 by means of the bonding layer 63 (or optionally by means of the further bonding layer 64).

Figure 1G:
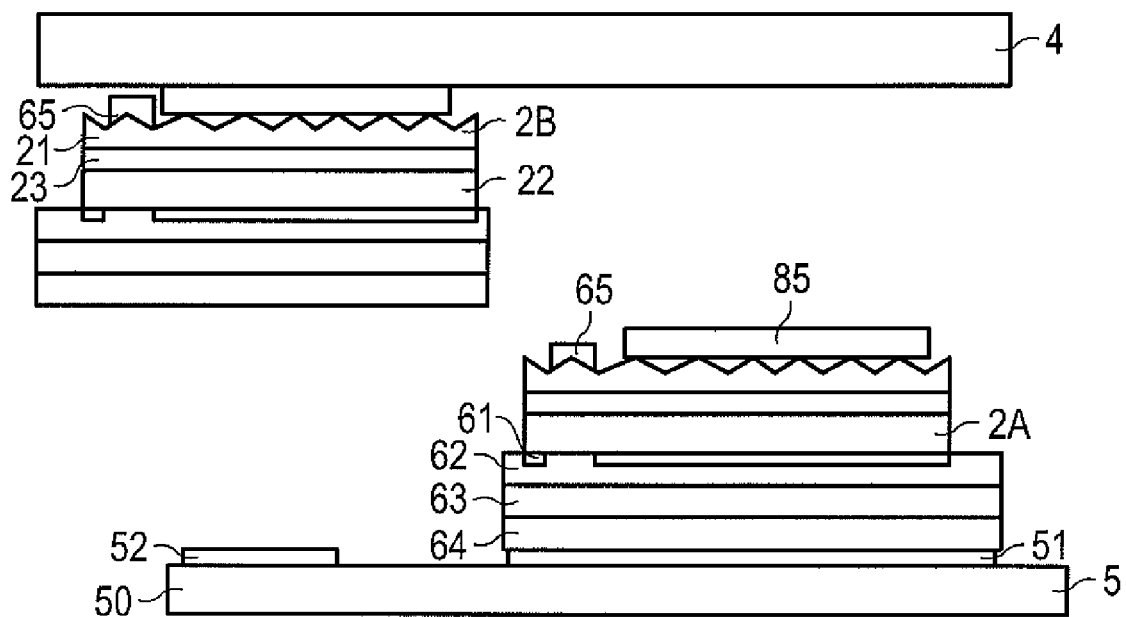

On the other hand, the semiconductor body 2B remains at least initially on the second auxiliary carrier 4 (FIG. 1G). The second auxiliary carrier may subsequently be positioned relative to the connection carrier 50 in such a way that the semiconductor body 2B overlaps with a connection carrier region associated therewith, such that the semiconductor body 2B may be fixed to the connection carrier. In this way, the connection carrier regions and the semiconductor bodies may be arranged on the second auxiliary carrier largely independently of one another. In particular, the connection carrier regions may be arranged with a greater mutual center-to-center distance than the semiconductor bodies.

It goes without saying that the connection carrier regions and the positions of the semiconductor bodies on the second auxiliary carrier may be matched with one another such that, at least in one spatial direction, a plurality of semiconductor bodies are simultaneously suitably positioned relative to a connection carrier region.

In the other hand, semiconductor bodies 2 which do not meet requirements in terms of their electrical characteristics or their spectral emission characteristics remain on the second auxiliary carrier 4. Thus, the connection carrier 50 is only populated with semiconductor bodies which meet the predetermined requirements. The number of semiconductor components which have to be discarded after passing through all the production steps in this way greatly reduced.

Preferably, the semiconductor bodies 2 initially adhere to the connection carrier regions 5 due to adhesive forces. To this end, an additional bonding layer, for instance a solder paste or an adhesive (not explicitly illustrated), may be provided on the connection carrier, as an alternative or in addition to the bonding layer 63 or to the further bonding layer 64.

The semiconductor bodies 2 may then be durably fixed to the connection carrier regions. This may proceed in particular over the entire area, once all the connection carrier regions have been populated with semiconductor bodies. Depending on the bonding layer used, hardening of a solder paste or curing of an adhesive layer may thus be carried out jointly for the connection carrier regions.

Once the semiconductor bodies 2 have been fixed to the connection carrier regions 5, the connection carrier 50 may be singulated, such that singulation gives rise to finished semiconductor components with in each case one semiconductor body and one connection carrier region.

Figure 1H:
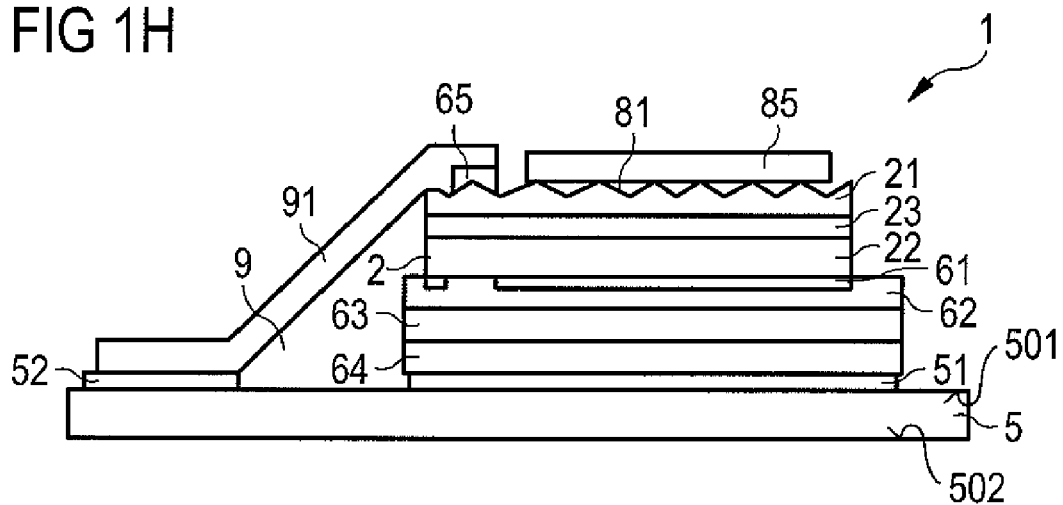

A finished semiconductor component is illustrated in FIG. 1H. In the case of this semiconductor component, a ramp 9 is formed on the connection carrier region 5, to the side of the semiconductor body 2, i.e. in a direction extending in a main direction of extension of the semiconductor layers of the semiconductor layer sequence 20 of the semiconductor body. On the ramp there extends a contact track 91, which serves for electrical connection between a contact provided on the connection carrier region 5 for external contacting (not explicitly illustrated) and the semiconductor body 2 from the side of the active region 23 remote from the connection carrier region 5.

In particular, the ramp 9 and the contact track 91 may even be formed prior to singulation of the semiconductor components. Production may thus proceed simultaneously for all the semiconductor components on the connection carrier. Subsequent, in particular individual, contacting of the respective first semiconductor layer 21 may be dispensed with.

On singulation, semiconductor components may thus be produced in which the active regions 23 of the semiconductor bodies 2 have already been electrically connected with the associated connection carrier region from both sides, i.e. from the n-conducting side and from the p-conducting side.

An electrically insulating material is a particularly suitable material for the ramp, for example BCB (benzocyclobutene), silicon oxide or silicon nitride.

By means of the contact track, the first semiconductor layer 21 arranged on the side of the active region 23 remote from the connection carrier region may be electrically contacted externally at the level of the first major surface 501 of the connection carrier region. It is thus simply possible to construct the semiconductor body without a wire bond connection. Shading of the semiconductor body by the wire bond connection is thereby avoided, such that the radiation generated in the active region 23 may exit unimpeded.

On the other hand, the method may however also be used for semiconductor components in which the semiconductor body is provided with a wire bond connection or is intended for a wire bond connection, wherein the top of the semiconductor body may be configured for external contacting.

Figure 2A:
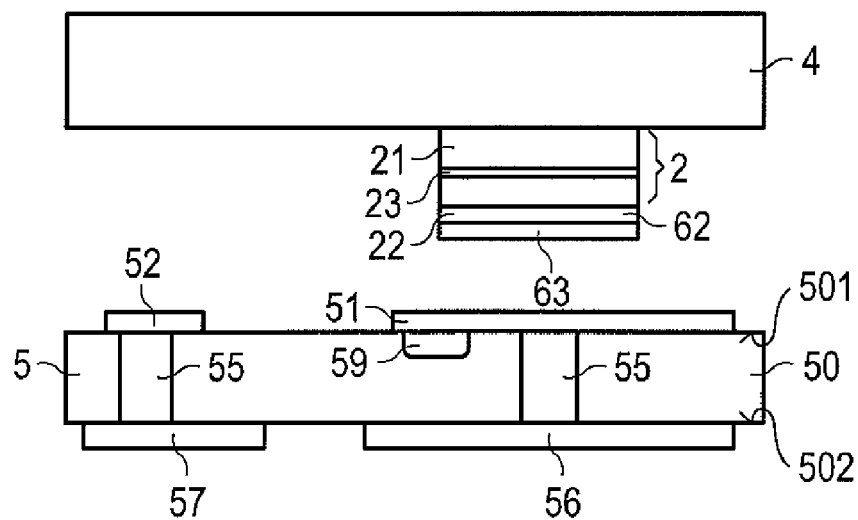
FIGS. 2A to 2C show a second exemplary embodiment of a method of producing a semiconductor component by means of an intermediate step in schematic sectional view in FIG. 2A and a finished semiconductor component in FIG. 2B in schematic sectional view and in the associated plan view (FIG. 2C)
Figure 2B:
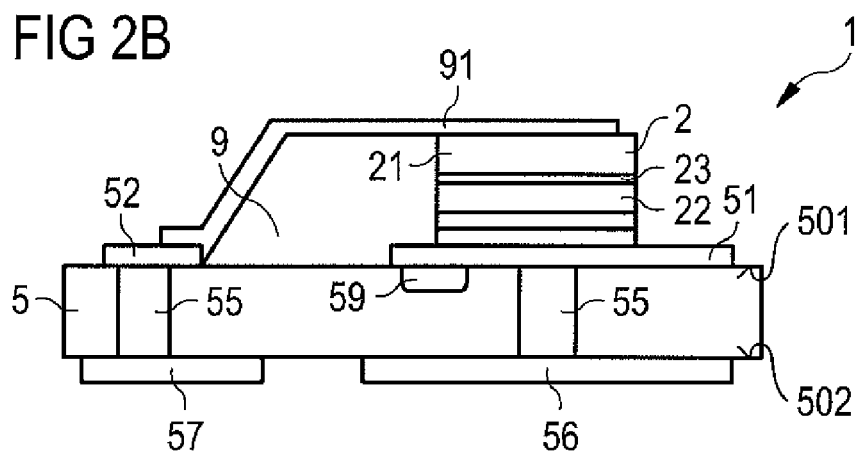
Figure 2C:
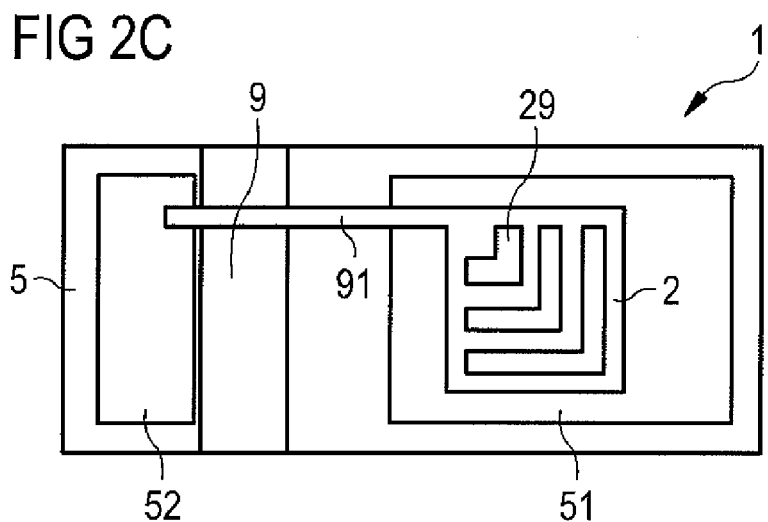

A second exemplary embodiment of a method of producing a semiconductor component is illustrated schematically in FIGS. 2A to 2C. This second exemplary embodiment substantially corresponds to the first exemplary embodiment described in relation to FIGS. 1A to 1H. In particular, the method may initially be carried out as described in relation to FIGS. 1A to 1F.

To simplify the illustration, FIG. 2A shows just one semiconductor body 2 on the second auxiliary carrier 4. Unlike in the first exemplary embodiment, the connection carrier 50 comprises openings 55 in each connection carrier region 5. The openings extend from a first major surface 501 to a second major surface 502 of the connection carrier 50.

On the side remote from the semiconductor body 2, the connection carrier 50 comprises a first contact 56 and a second contact 57, which are each provided for external electrical contacting of the semiconductor component.

The first contact 56 and the second contact 57 are each connected electrically conductively via the openings 55 to the connection surface 51 or respectively a second connection surface 52. Furthermore, the connection carrier region 5 comprises a protection diode 59, which is integrated into the connection carrier.

The protection diode 59 may for example be formed by means of an n-conducting (p-conducting) region of the connection carrier, which is formed in an otherwise p-conducting (n-conducting) connection carrier. Such a region may for example be formed by means of ion implantation.

The connection carrier is conveniently based on a semiconductor material, in particular on silicon. Gallium arsenide or germanium may also be used.

The protection diode 59 is thus formed by means of a pn-junction, which, with regard to its passage direction, is oriented antiparallel to the passage direction of the semiconductor body 2.

In the event of electrostatic charging arising in the reverse direction when the semiconductor component is in operation, the charge carriers may flow away via the protection diode 59, such that the semiconductor body 2 is protected from ESD damage.

In particular, the semiconductor body 2 may be protected from ESD damage as early as at a point in the manufacturing method at which the connection carrier 50 has not yet been singulated into a plurality of connection carrier regions. On singulation of the connection carrier, semiconductor components are thus produced which already comprise an integrated protection diode.

FIG. 2C is a plan view of a finished semiconductor component 1.

The contact track 91 comprises a plurality of openings 29 on the semiconductor body 2, which preferably extend through the contact track to the semiconductor body. The radiation generated in the active region 23 when the semiconductor body 2 is in operation may thus pass unimpeded through the openings.

Figure 3A:
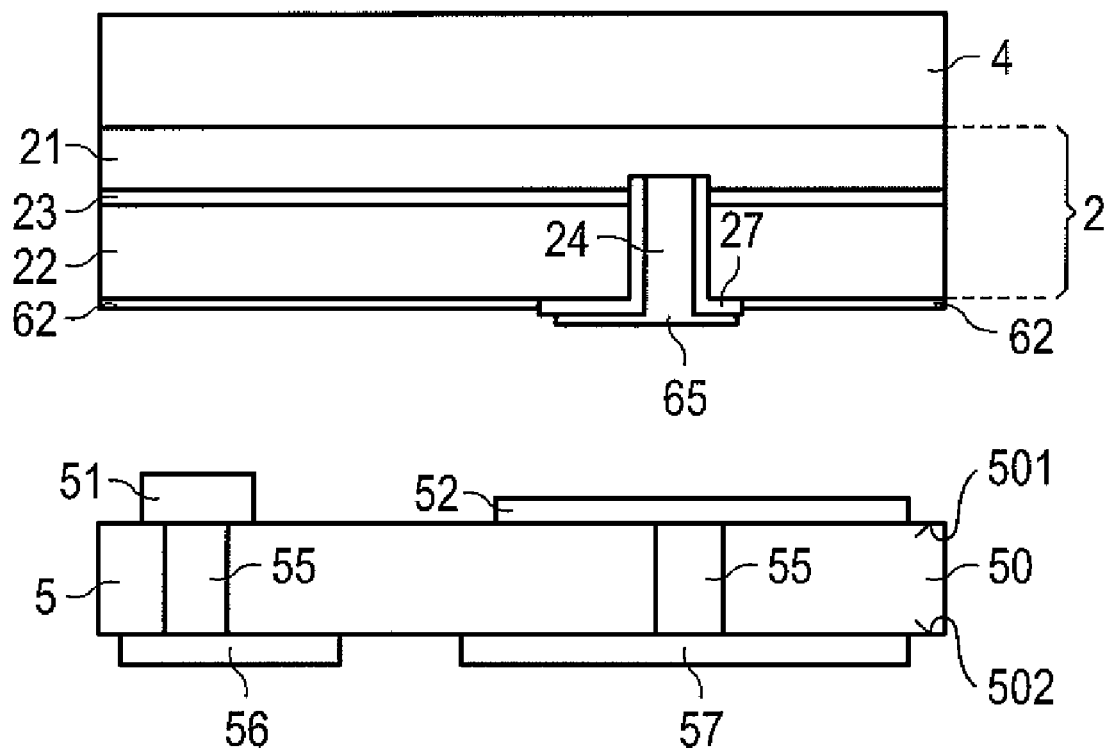
FIGS. 3A and 3B show a third exemplary embodiment of a method of producing a semiconductor component by means of an intermediate step in FIG. 3A and a finished semiconductor component in FIG. 3B in each case in schematic sectional representation.
Figure 3B:
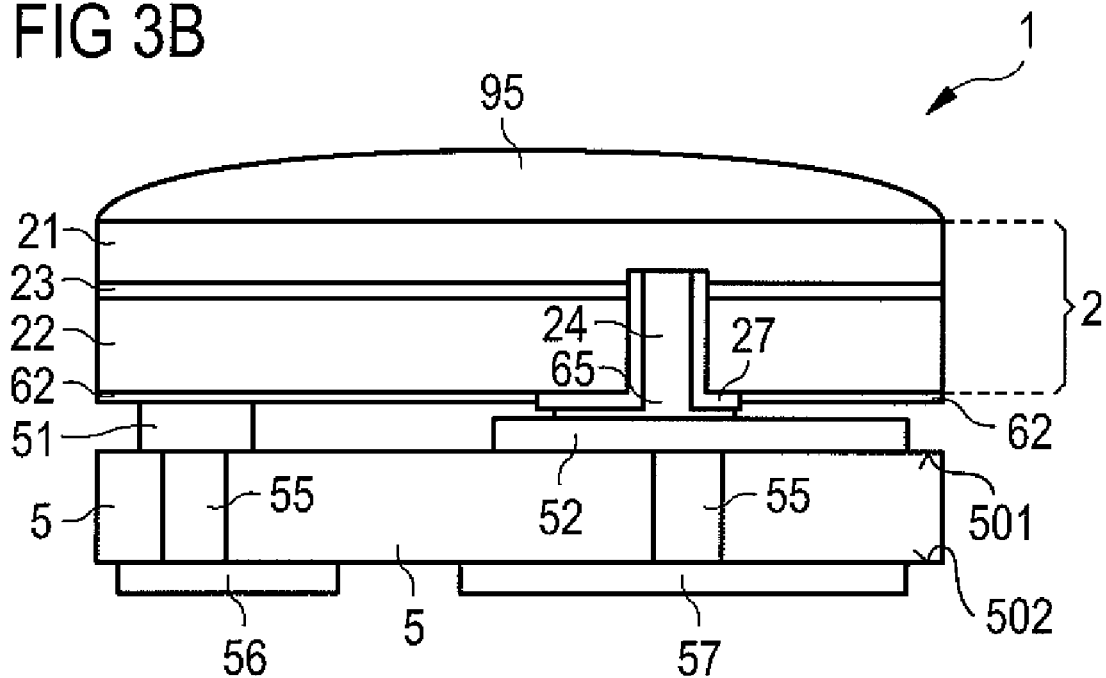

A third exemplary embodiment of a method of producing a semiconductor component is shown in schematic sectional view in FIGS. 3A and 3B.

This third exemplary embodiment substantially corresponds to the first exemplary embodiment. In contrast thereto, semiconductor bodies 2 are provided on the second auxiliary carrier 4 which comprise a contact recess 24. The contact recess extends from a side of the semiconductor body 2 remote from the second auxiliary carrier through the second semiconductor layer 22 and the active region 23 into the first semiconductor layer 21. A counter-contact layer 65 is formed in the contact recess 24, which layer produces an electrical connection to the first semiconductor layer 21. To prevent electrical short-circuiting, an insulation layer 27 is formed on the side face of the contact recess 24, which insulation layer appropriately contains electrically insulating material, for example silicon nitride or silicon oxide.

By means of the contact recess 24, the first semiconductor layer may be electrically contacted from the side of the connection carrier 50. The semiconductor body 2 may thus be free of contact layers on the side remote from the connection carrier 50. Unlike in the illustration provided, the semiconductor body may also comprise a plurality of such contact recesses, which are arranged next to one another in the lateral direction, for example in the manner of a matrix. Laterally uniform injection of charge carriers via the first semiconductor layer 21 into the active region 23 is thereby achieved in a simplified manner.

In this exemplary embodiment the connection carrier 50 is provided with openings 55, as described in relation to FIG. 2A. In contrast, the first contact 56 and/or the second contact 57 may however also be provided on the first major surface 501 of the connection carrier 50. In this case the openings 55 may be completely or at least partially dispensed with.

FIG. 3B shows a finished semiconductor component. An optical element 95 is provided on the semiconductor body 2. The optical element may be embodied as, for example, a prefabricated element, for instance of a prefabricated lens. For example, the optical element may contain plastics or a glass or consist of such a material.

In particular, the optical elements 95 may be arranged while the connection carrier 50 is still in one piece, i.e. before it is singulated into connection carrier regions 5, such that singulation produces semiconductor components with optical elements attached thereto.

On the other hand, the optical element 95 may also be formed on the semiconductor body 2. To this end, a moulding composition may for example be applied to the semiconductor body 2 and then cured. A resin or a silicone resin is for example suitable for the moulding composition.

It goes without saying that the semiconductor body 2 may also be provided in the method of production according to the second or third exemplary embodiment with a conversion layer and/or with structuring.

The invention is not limited by the description provided with reference to the exemplary embodiments, rather the invention encompasses any novel feature and any combination of features, including in particular any combination of features in the claims, even if this feature or this combination is not itself explicitly indicated in the claims or exemplary embodiments.

I claim:

1. A method of producing a semiconductor component, comprising at least one semiconductor body and one connection carrier region, comprising the steps of:
    a) providing a semiconductor layer sequence with an active region intended for generating radiation on a substrate;
    b) arranging the semiconductor layer sequence on a first auxiliary carrier;
    c) removing the substrate;
    d) forming a plurality of semiconductor bodies from the semiconductor layer sequence;
    e) arranging a second auxiliary carrier on the side of the semiconductor layer sequence remote from the first auxiliary carrier;
    f) removing the first auxiliary carrier;
    g) providing a connection carrier with a plurality of connection carrier regions;
    h) positioning the second auxiliary carrier relative to the connection carrier in such a way that at least one of the semiconductor bodies overlaps an associated connection carrier region when viewed in plan view; and
    i) transferring the at least one semiconductor body onto the connection carrier region.

2. The method as claimed in claim 1, wherein a separation layer is formed between the semiconductor layer sequence and the first auxiliary carrier.

3. The method as claimed in claim 2, wherein the separation layer contains a nitride.

4. The method as claimed in claim 2, wherein the first auxiliary carrier is removed in step f) by means of at least partial decomposition of the separation layer.

5. The method as claimed in claim 4, wherein the separation layer is decomposed by means of coherent radiation, which is directed through the first auxiliary carrier.

6. The method as claimed in claim 1, wherein an electrically conductive bonding layer is applied to the semiconductor layer sequence prior to step b).

7. The method as claimed in claim 6, wherein the semiconductor bodies are electrically tested prior to step i), preferably prior to step e), the semiconductor bodies comprising a common contact layer on the side facing the first auxiliary carrier.

8. The method as claimed in claim 1, wherein the second auxiliary carrier is a foil, in which an adhesive property is locally modifiable.

9. The method as claimed in claim 8, wherein in step i) the adhesive property of the second auxiliary carrier is reduced by local input of heat into the second auxiliary carrier.

10. The method as claimed in claim 1, wherein prior to step e) a conversion layer is applied to the semiconductor layer sequence.

11. The method as claimed in claim 10, wherein a color locus of the radiation emitted in operation by the semiconductor body and by the conversion layer is determined prior to step i).

12. The method as claimed in claim 1, wherein the semiconductor components are formed after step i) by singulation of the connection carrier.

13. The method as claimed in claim 12, wherein the active region is connected electrically conductively to the connection carrier region from both sides prior to singulation of the connection carrier.

14. The method as claimed in claim 1, wherein a centre-to-centre distance between adjacent connection carrier regions on the connection carrier is greater in at least one direction than a centre-to-centre distance between adjacent semiconductor bodies on the second auxiliary carrier.

15. The method as claimed in claim 1, wherein the connection carrier regions each comprise a protection diode, which is integrated into the connection carrier regions.

* * * * *